United States Patent [19]

Latos

[11] Patent Number: 5,025,360
[45] Date of Patent: Jun. 18, 1991

[54] INVERTER SWITCH WITH PARALLEL FREE-WHEEL DIODES

[75] Inventor: Thomas S. Latos, Huntley, Ill.

[73] Assignee: Sundstrand Corporation, Rockford, Ill.

[21] Appl. No.: 453,751

[22] Filed: Dec. 20, 1989

[51] Int. Cl.⁵ .......................................... H02M 3/335
[52] U.S. Cl. ...................................... 363/16; 363/56; 363/132; 307/253
[58] Field of Search .................. 363/16, 17, 56, 131, 363/132; 307/253, 254

[56] References Cited

U.S. PATENT DOCUMENTS

| | | | |
|---|---|---|---|
| 4,010,387 | 3/1977 | Akamatsu | 307/253 |
| 4,458,305 | 7/1984 | Buckle et al. | 363/141 |
| 4,535,399 | 8/1985 | Szepesi | 363/16 |
| 4,566,059 | 1/1986 | Gallios et al. | 363/17 |
| 4,570,213 | 2/1986 | Ljung | 307/253 |
| 4,626,980 | 12/1986 | McGuire | 363/56 |
| 4,768,141 | 8/1988 | Hubertus et al. | 363/16 |
| 4,814,962 | 3/1989 | Magalhaes et al. | 363/16 |
| 4,816,981 | 3/1989 | Nishihiro et al. | 363/37 |
| 4,816,984 | 3/1989 | Porst et al. | 363/56 |
| 4,830,979 | 5/1989 | Crowe et al. | 437/216 |

Primary Examiner—Peter S. Wong
Attorney, Agent, or Firm—Marshall, O'Toole, Gerstein, Murray & Bicknell

[57] ABSTRACT

Apparatus comprising a module formed by a transistor, a first diode connected in antiparallel with said transistor, and a second diode connected in series opposition with said transistor. The transistor and the diodes of the module are grouped closely together to substantially reduce parasitic inductance. Two modules are connected to form an associated pair of one phase of a three-phase inverter.

7 Claims, 2 Drawing Sheets

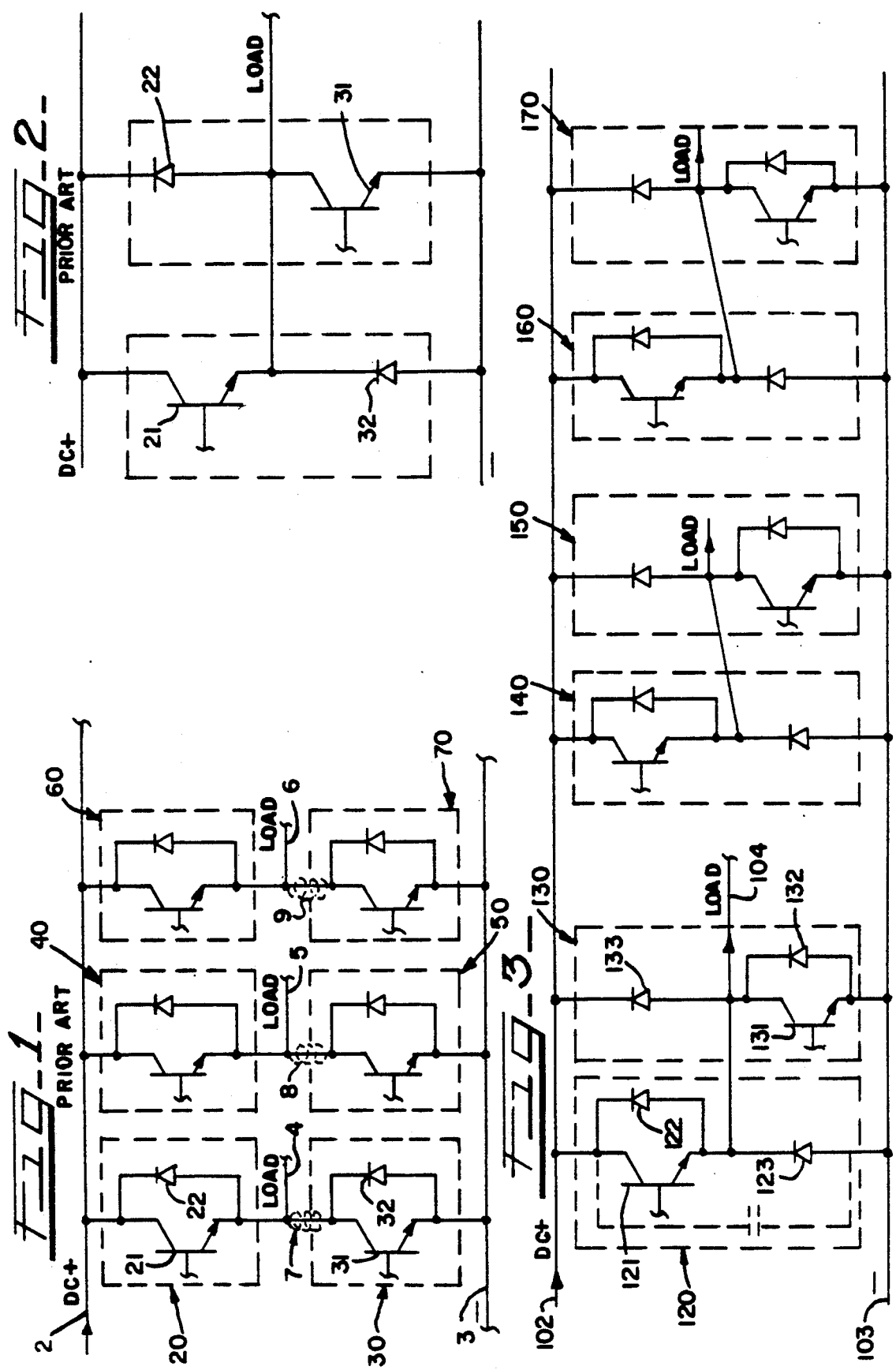

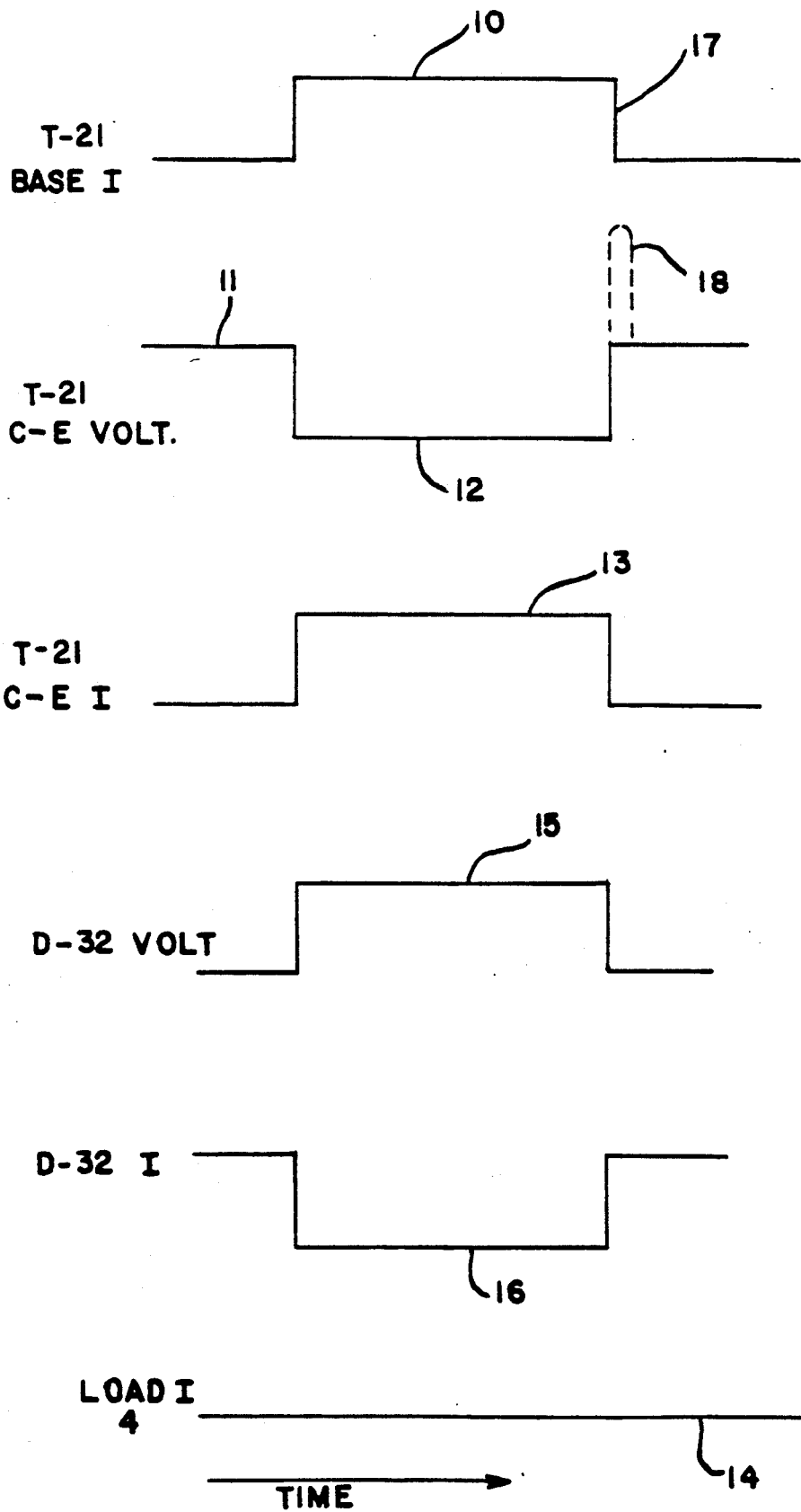

INVERTER SWITCH WITH PARALLEL FREE-WHEEL DIODES

FIELD AND BACKGROUND OF THE INVENTION

This invention relates to a transistor switch assembly, and more particularly to such a switch assembly having reduced parasitic inductance.

Transistor switches are widely used in power circuits for controlling the flow of power to a load. For example, a conventional three-phase inverter includes transistor switches for converting a direct current input to a three-phase AC power supply. Such an inverter includes six building blocks or modules, the blocks being arranged in three pairs (see FIG. 1 herein which will be discussed later) connected across the DC input. Each block includes a switch transistor and an antiparallel diode connected across it. During operation of the circuit, parasitic inductance in the wiring between the blocks of a pair results in undesirable voltage peaks across the transistor of each block at the instant of switching. These peaks may be accommodated by increasing the size and weight of a transistor snubber circuit connected in parallel with the transistor, but a more advantageous solution would be to substantially reduce the undesirable parasitic inductance.

Nishihiro et al. U.S. Pat. No. 4,816,981, and Porst et al. U.S. Pat. No. 4,816,984 show circuits including inverters. The Nishihiro patent shows building blocks as discussed above, and the Porst patent shows circuits and physical layouts of the components for reducing the effects of voltage peaks which occur during switching.

It is a general object of the present invention to provide an improved circuit which overcomes the disadvantages of the prior art.

SUMMARY OF THE INVENTION

Apparatus in accordance with a first feature of this invention comprises a module formed by a transistor, a first diode connected in antiparallel with said transistor, and a second diode connected in series opposition with said transistor.

In accordance with a second feature, the transistor and the diodes of the module are grouped closely together to substantially reduce parasitic inductance.

In accordance with a third feature, two modules are connected to form an associated pair of one phase of a three-phase inverter.

BRIEF DESCRIPTION OF THE DRAWINGS

The invention will be better understood from the following detailed description taken in conjunction with the accompanying figures of the drawings, wherein:

FIG. 1 is a schematic diagram showing a prior art inverter construction;

FIG. 2 is a schematic diagram illustrating an alternative arrangement of the components of an inverter;

FIG. 3 illustrates an inverter constructed in accordance with a preferred embodiment of this invention; and FIG. 4 shows wave forms which illustrate the operation of an inverter.

DETAILED DESCRIPTION OF THE DRAWINGS

FIG. 1 shows a prior art three-phase inverter 1 which is connected across a DC supply including a positive DC line 2 and a negative DC line 3. The two lines 2 and 3 may be a DC link which is also connected to a full wave bridge rectifier (not shown) which converts AC to DC, and in this type of arrangement a capacitor (also not shown) is normally connected across the two lines 2 and 3 in order to remove any ripple voltage present in the DC link.

The inverter 1 comprises six building blocks or modules 20, 30, 40, 50, 60, and 70. The two blocks 20 and 30 form an associated pair of one of the three phases, the two blocks 40 and 50 form a second pair for the second phase, and the two blocks 60 and 70 form a third pair for the third phase. The two blocks of each pair are connected across the two DC lines 2 and 3, and load lines 4, 5 and 6 are connected to the junctures between the building blocks of each pair, as shown in FIG. 1.

In the conventional construction, the diode 22 and the transistor 21 of the block 20, for example, are physically grouped close together, thereby reducing the parasitic inductance which is always present at least to some extent in wires connecting two components. However, the components of the block 20 are not physically close to the components of the block 30, and as a consequence a parasitic inductance, illustrated schematically by the winding 7, is present in the wire connecting the two blocks 20 and 30. Similar parasitic inductances 8 and 9 are present in the wires connecting the blocks of the other pairs.

The operation of the two blocks 20 and 30 is illustrated in connection with the wave forms of FIG. 4 which show currents and voltages as functions of time, and it should be understood that the pairs of blocks of the other two phases operate similarly. As is well known to those skilled in the art, square wave current pulses 10 appear sequentially on the bases of the transistors of the building blocks, to produce three-phase AC voltages on the load lines 4, 5 and 6. When the transistor 21, for example, is turned on by a positive square wave pulse 10 appearing on its base, the voltage across the collector-emitter terminals of the transistor 21 falls from the voltage level 11 on the DC line 2 down to zero level indicated by the line 12 in FIG. 4. Simultaneously the current through the transistor 21 rises and forms a square wave pulse 13. At this time, the transistor 31 of the block 30 is turned off, and the current through the transistor 21 flows through the load line 4, the load current being indicated by the numeral 14 in FIG. 4. In this analysis the load current remains constant as shown by the line 14. When the transistor 21 is turned on, the voltage across the lines 2 and 3 also appear across the diode 32 as shown by the positive voltage pulse 15 in FIG. 4, but at this time the diode 32 does not conduct, as shown by the wave form 16.

At the trailing edge 17 of the pulse 10 on the base of the transistor 21, it is turned off and the voltage 12 across the transistor 21 rises, the current 13 through the transistor 21 falls, the voltage 15 across the diode 32 falls, and the current which previously flowed through the transistor 21 switches to the diode 32. As a consequence the current 16 through the diode 32 increases.

However, at the switching instant when the transistor 21 is turned off and the current flow switches from the transistor 21 to the diode 32, the parasitic inductance 7 produces a relatively sharp, short-term voltage peak 18 across the transistor 21. To protect the building block against damage due to the peak 18, the circuit components and any conventional snubber circuits (not shown) are required to be relatively large.

The amount of the parasitic inductance 10 may be reduced by physically grouping the diode 32 close to the transistor 21, but this is difficult to do. It is more important that the diode 32 be physically close to the transistor 31 and the diode 22 be physically close to the transistor 21. As a consequence, if the diode 32 were to be located close to the transistor 21 it would require that all four components 21, 22, 31 and 32 be configured physically close to each other. As commented above, this is difficult to do in practice. The construction shown in the above-mentioned Porst patent appears to take this approach.

Another alternative arrangement is illustrated in FIG. 2, wherein the transistor 21 and the diode 32 are grouped physically close to each other in a single building block in order to reduce the parasitic inductance between them. However, the arrangement shown in FIG. 2 has the disadvantage that the diode 22 is now grouped with the transistor 31, and the diode 22 is no longer physically close to the transistor 21, thereby increasing the parasitic inductance between the transistor 21 and the diode 22. The arrangement shown in FIG. 2 thus decreases the effectiveness of the diode 22 in its function of limiting the reverse voltage applied across the transistor 21.

The foregoing disadvantages are substantially avoided in the arrangement shown in FIG. 3, which includes an inverter 101 connected between two DC power lines 102 and 103. The inverter 101 comprises three pairs of building blocks, the pair of blocks 120 and 130 carrying one phase, the building blocks 140 and 150 of the second pair carrying a second phase and the blocks 160 and 170 of the third pair carrying the third phase. The blocks 120 and 130 are described in detail, and the other blocks 140-160 are constructed and operate similarly.

The block 120 comprises a transistor 121, a diode 122 connected in antiparallel with it, and a diode 123 connected in series opposition to the primary direction of conductance of the transistor 121. The series connection of the transistor 121 and the diode 123 is connected across the two lines 102 and 103.

Similarly, the other block 130 of the pair comprises a transistor 131, an antiparallel diode 132, and a diode 133 connected in series opposition with the transistor 131. The transistor 131 and the diode 133 are also connected across the lines 102 and 103. The load line 104 is connected to the junctures of the transistor 121 and the diode 123 and the juncture of the transistor 131 and the diode 133. In each of the blocks, the three components are grouped physically close to each other so that the parasitic inductance of the conductors is relatively low. For the block 120, the primary direction of the transistor 121 current flow is from the line 102 to the load line 104, and for the block 130, the primary direction through the transistor 131 is from the line 104 to the line 103.

Considering the operation of the circuit shown in FIG. 3, assume that the transistor 121 is biased on by a pulse 10 and current flows from the line 102, through the transistor 121 and to the load line 104. At the instant 17 when the transistor 121 is biased off, current is forced to flow through the diode 123 which is located physically close to the transistor 121 and the diode 122. Since they are located close together, the parasitic inductance between the transistor 121 and the diode 123 is very small and the voltage peak 18 is very small. After the switching instant is over, the current flowing to the load line 104 is shared between the diodes 123 and 132. The diode 122 provides the reverse voltage clamp across the transistor 121, similar to the functioning of the diode 22 of the block 20.

The operation of the other blocks is identical with that of the block 120 except that in the block 130 the current flows from the line 104, through the transistor 131 to the line 103. The transistor 131 and the two diodes 132 and 133 are physically close to each other.

It will be apparent therefore that the arrangement of a transistor 121 in close physical proximity with the two diodes 122 and 123 reduces the parasitic inductance between the components of the module. While an extra diode is required in each of the modules compared with the prior art inverter shown in FIG. 1, the reduction in the parasitic induction outweighs the disadvantage of providing the extra diode. Further, physically grouping the transistor 121 and the diodes 122 and 123 of the module is relatively easily accomplished as compared with an attempt to group the four components of a pair of two modules closely together as previously discussed.

When the present description speaks of components being physically close or intimate, it should be understood that the term "close" is used in an electrical inductance sense. The amount of inductance in a conductor connecting the transistor 21 and the diode 32 of the prior art construction, for example, is determined by the distance between the components and the type of conductor employed, such as round wire, flat wire or plates, printed circuit board conductors, etc. In the typical prior art inverter 1, the parasitic induction 7 amounts to approximately 1 microhenry ($1 \times 10^{-6}$). In the building block 120 of the present invention having the same type of wire as in the prior art module, the amount of inductance between the transistor 121 and the diode 123 is reduced to approximately 50 nanohenries ($50 \times 10^{-9}$ henries). This is a reduction of about 20 times from a circuit constructed in accordance with conventional practice. The parasitic induction between the transistor 121 and the diode 122 is essentially the same as between the corresponding parts of a prior art construction.

Reference is made to the copending application filed on the same date as the present application by Thomas Sutrina et al. and titled "Low Inductance Converter Phase Assembly" which discloses an arrangement of the components of a building block or module. The disclosure of the Sutrina et al. application is incorporated herein by reference.

It will be apparent from the foregoing that a novel and useful circuit has been provided for reducing the parasitic induction in a transistor switch assembly such as in the building blocks of an inverter. A diode is added in series with the transistor and grouped closely with the transistor and the antiparallel diode. The resulting reduction in the parasitic induction substantially reduces the voltage peak which is present in prior art circuits at the instant of switching, thereby permitting smaller scale components in each building block.

While not shown in the drawings, each module may include a capacitor connected in parallel with the series connection of the transistor and the series diode. Such a capacitor would replace the capacitor normally connected across the lines of a DC link.

Although FIG. 3 shows only a single transistor in each module, the invention also encompasses a plurality of transistors in a Darlington arrangement, as shown in the above-mentioned T. Sutrina et al. application. In such a Darlington transistor circuit, a driver transistor receives the control signals, the antiparallel diode 122 of the module 120, for example, is connected in parallel with one or more driven transistors, and the series diode 123 is connected in series with the driven transistor(s).

What is claimed is:

1. A module of components grouped physically close to each other, comprising a transistor, an antiparallel diode connected across said transistor, and a series diode connected in series with said transistor, the primary directions of conductance of said transistor and said series diode being in opposition.

2. A module as set forth in claim 1, and further including a junction connected between said transistor and said series diode and adapted to be connected to a load.

3. An associated pair of modules adapted to be connected in parallel across first and second power supply conductors, each of said modules comprising a transistor, a first diode and a second diode, said first and second diodes and said transistor each having a primary direction of conduction, said first diode being connected in antiparallel with said transistor, and said second diode being connected in series with said transistor such that the primary direction of conduction of said transistor is opposite the primary direction of conduction of said second diode, junction means between said transistor and said second diode, said junction means of said pair of modules being connected together and adapted to be connected to a load, said modules being adapted to be connected to said power supply conductors.

4. Apparatus as set forth in claim 3, wherein said transistor and said first and second diodes of each of said modules are grouped closely together to result in low parasitic inductance therebetween.

5. Apparatus as set forth in claim 3, and further including second and third associated pairs of modules which are substantially identical with said modules of said first-mentioned pair, said pairs of modules being interconnected to form a three-phase inverter.

6. Apparatus as set forth in claim 3, wherein said transistor of one of said modules is connected to conduct current from said first power supply conductor to said junction means, and said transistor of the other of said modules is connected to conduct current from said junction means to said second power supply conductor.

7. A phase circuit of an inverter adapted to be connected between first and second supply conductors, comprising first and second transistors connected in series and adapted to be connected across aid supply conductors, said transistors being connected for the same direction of primary conductance, first and second diodes connected in antiparallel with said first and second transistors, respectively, third and fourth diodes connected in antiparallel with said first and second transistors, respectively, and junction means connected to each of said transistors and adapted to be connected to a load, wherein said first transistor, said first diode and said fourth diode are grouped closely together in a first module, and said second transistor, said second diode and said third diode are grouped closely together in a second module.

* * * * *